(12) United States Patent
Zhang et al.

(10) Patent No.: US 11,713,509 B2
(45) Date of Patent: Aug. 1, 2023

(54) FLOW GUIDE APPARATUS AND VAPOR DEPOSITION DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qiang Zhang, Beijing (CN); Beumku Park, Beijing (CN); Yuanjiang Yang, Beijing (CN); Tianming Li, Beijing (CN); Qingke He, Beijing (CN); Jie Li, Beijing (CN); Ya Zhu, Beijing (CN); Yu Wang, Beijing (CN); Fujun Yuan, Beijing (CN); Binglei Cao, Beijing (CN); Xinxin Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 153 days.

(21) Appl. No.: 17/237,118

(22) Filed: Apr. 22, 2021

(65) Prior Publication Data
US 2021/0332480 A1    Oct. 28, 2021

(30) Foreign Application Priority Data

Apr. 23, 2020 (CN) .......................... 202020631414.5

(51) Int. Cl.
*C23C 16/40* (2006.01)
*C23C 16/455* (2006.01)
*H01L 27/12* (2006.01)

(52) U.S. Cl.
CPC .... *C23C 16/45591* (2013.01); *H01L 27/1214* (2013.01)

(58) Field of Classification Search
CPC ........ C23C 16/45591; C23C 16/45565; H01L 27/1214
USPC ........................ 118/715; 156/345.33, 345.34
See application file for complete search history.

(56) References Cited

U.S. PATENT DOCUMENTS 10,883,174 B2* 1/2021 Lau .................. C23C 16/45591
2017/0314125 A1* 11/2017 Fenwick .............. C23C 16/405
2020/0165726 A1* 5/2020 Lau .................. C23C 16/45591

* cited by examiner

*Primary Examiner* — Rudy Zervigon
(74) *Attorney, Agent, or Firm* — Dority & Manning, P.A.

(57) ABSTRACT

A flow guide apparatus includes a columnar flow guide portion, a plurality of connection portions and a loop portion. The columnar flow guide portion includes a first surface and a second surface that are perpendicular to a thickness direction thereof, and a blind hole formed in the second surface. A center line of the columnar flow guide portion is parallel to the thickness direction thereof. The plurality of connection portions are arranged at intervals and are at least connected with an edge of the second surface of the columnar flow guide portion. The loop portion is connected with the plurality of connection portions, and is farther away from the columnar flow guide portion than the plurality of connection portions.

19 Claims, 8 Drawing Sheets

FLOW GUIDE APPARATUS AND VAPOR DEPOSITION DEVICE

CROSS-REFERENCE TO RELATED APPLICATION

This application claims priority to Chinese Patent Application No. 202020631414.5, filed on Apr. 23, 2020, which is incorporated herein by reference in its entirety.

TECHNICAL FIELD

The present disclosure relates to the technical field of vapor deposition, and in particular, to a flow guide apparatus and a vapor deposition device.

BACKGROUND

Vapor deposition is a common process for forming films. Specifically, films are formed by using a vapor deposition device. A raw material for forming a film enters an internal space through a gas inlet in a form of gas, and then the gas is deposited on a substrate after being dispersed by a flow guide apparatus inside the vapor deposition device, so as to form a uniform film. The vapor deposition includes various deposition processes such as chemical vapor deposition (CVD), physical vapor deposition (PVD) and atomic layer deposition (ALD) according to different methods for forming films.

For example, in the manufacturing field of display apparatuses, CVD is usually used for multiple times to coat a substrate (e.g., a glass substrate) in a vapor deposition device to form various functional films on the substrate.

SUMMARY

In one aspect, a flow guide apparatus is provided. The flow guide apparatus includes a columnar flow guide portion, a plurality of connection portions and a loop portion. The columnar flow guide portion includes a first surface and a second surface that are perpendicular to a thickness direction thereof, and a blind hole formed in the second surface. A center line of the columnar flow guide portion is parallel to the thickness direction thereof. The plurality of connection portions are arranged at intervals, and are at least connected with an edge of the second surface of the columnar flow guide portion. The loop portion is connected with the plurality of connection portions, and is farther away from the columnar flow guide portion than the plurality of connection portions.

In some embodiments, a cross section of the columnar flow guide portion parallel to the first surface has a shape of an approximate circle.

In some embodiments, an inner ring of the loop portion has a circular shape.

In some embodiments, a diameter of the circle is in a range of 23 mm to 27 mm, inclusive.

In some embodiments, the flow guide apparatus further includes an auxiliary flow guide portion disposed on a surface of the columnar flow guide portion. In a direction pointing from the second surface to the first surface, an area of a cross section of the auxiliary flow guide portion parallel to the first surface decreases.

In some embodiments, the surface where the auxiliary flow guide portion is located is the first surface.

In some embodiments, a flow guide surface of the auxiliary flow guide portion has a shape of an approximate circular conical surface or at least a part of a spherical surface.

In some embodiments, the columnar flow guide portion further includes a side face connected with the first surface and the second surface. The surface where the auxiliary flow guide portion is located is the side face. The auxiliary flow guide portion and the columnar flow guide portion are of an integral structure in a shape of a truncated circular cone.

In some embodiments, each connection portion is further directly connected with the auxiliary flow guide portion.

In some embodiments, the columnar flow guide portion further includes a side face connected with the first surface and the second surface, and each connection portion is further connected with the side face.

In some embodiments, in a direction from the columnar flow guide portion to the loop portion, a thickness of a portion of the connection portion connected with the side face decreases.

In some embodiments, the plurality of connection portions are bent toward a clockwise direction or a counter-clockwise direction.

In some embodiments, a number of the plurality of connection portions is three, four or five.

In some embodiments, the loop portion includes a plurality of through holes.

In some embodiments, the loop portion further includes a plurality of loop sub-portions and a plurality of intermediate sub-portions. Each intermediate sub-portion is located between two adjacent loop sub-portions, and is connected with a respective one of the plurality of connection portions. Each through hole is formed in a respective one of the plurality of loop sub-portions or the plurality of intermediate sub-portions.

In some embodiments, a material of the columnar flow guide portion includes light metal.

In some embodiments, the columnar flow guide portion further includes a main body portion and a corrosion prevention layer formed on a surface of the main body portion. A material of the main body portion is the light metal.

In some embodiments, a material of the columnar flow guide portion includes alumina or ceramic.

In another aspect, a vapor deposition device is provided. The vapor deposition device includes the flow guide apparatus according to any one of the above embodiments, a distributor disposed opposite to the flow guide apparatus, and a first fastener. The first fastener is matched with the blind hole and is connected with the distributor, and the distributor is fixed to the columnar flow guide portion through the first fastener.

In some embodiments, the loop portion includes a plurality of through holes. The vapor deposition device further includes a backplate and a plurality of second fasteners. The backplate is disposed on a side of the flow guide apparatus facing away from the distributor, each second fastener is matched with a respective one of the plurality of through holes, and the backplate is fixed to the loop portion through the plurality of second fasteners.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, and an actual process of a method to which the embodiments of the present disclosure relate.

DETAILED DESCRIPTION

Figure 1:
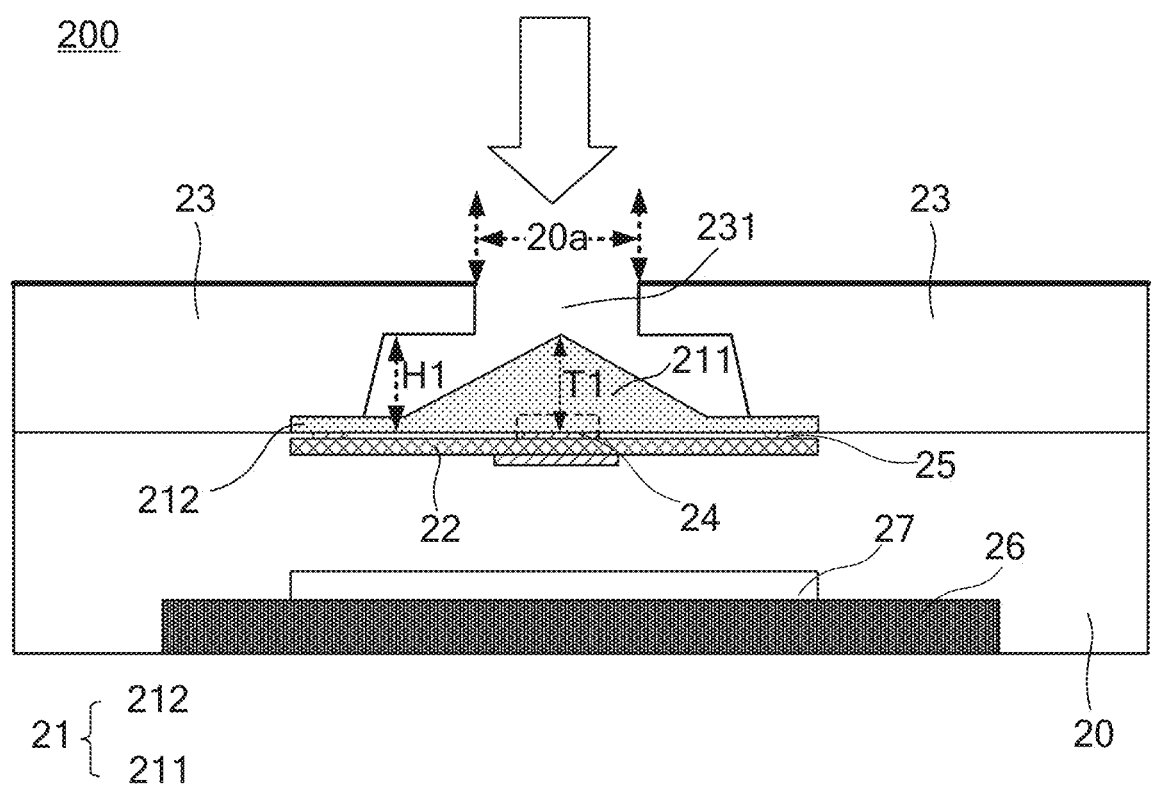
FIG. 1 is a schematic diagram illustrating a structure of a vapor deposition device.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first", "second" and the like are used for descriptive purposes only, and are not to be construed as indicating or implying the relative importance or implicitly indicating the number of indicated technical features. Thus, features defined as "first" and "second" may explicitly or implicitly include one or more of the features. As used in this description and the appended claims, the singular forms "a/an" and "the" may also include plural referents unless the content clearly dictates otherwise. In the description of the embodiments of the present disclosure, the term "a plurality of" means two or more unless otherwise specified.

The use of the phrase "applicable to" or "configured to" herein means an open and inclusive language, which does not exclude devices that are applicable to or configured to perform additional tasks or steps.

The term "about", "approximately/approximate" or "substantially" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. The exemplary embodiments of the present disclosure should not be construed to be limited to shapes of regions shown herein, but to include deviations in shape due to, for example, manufacturing. For example, an etched region that is shown in a rectangular shape generally has a curved feature, Therefore, the regions shown in the accompanying drawings are schematic in nature, and their shapes are not intended to show actual shapes of the regions in a device, and are not intended to limit the scope of the exemplary embodiments.

In a process of forming films, for example, a vapor deposition device 200 shown in FIG. 1 may be used. For example, in manufacturing processes of a thin film transistor liquid crystal display (TFT-LCD) or an active matrix organic light-emitting diode (AMOLED) panel, some films in the display/panel, such as a gate insulating film made of silicon nitride ($G-SiN_x$), a protective film made of silicon nitride ($PA-SiN_x$), a semiconductor film made of amorphous silicon (a-Si) and the like may all be formed by using the vapor deposition device 200.

As shown in FIG. 1, the vapor deposition device 200 includes a cavity 20, and a flow guide apparatus 21, a distributor 22, a backplate 23 and a carrier 26 that are disposed in the cavity 20. The cavity 20 is provided with a gas inlet 20a, which serves to introduce gas into the cavity 20, and a flow direction of the gas is shown by the downward arrow in FIG. 1. The backplate 23, the flow guide apparatus 21, the distributor 22 and the carrier 26 are disposed sequentially away from the gas inlet 20a. The carrier 26 is configured to carry a substrate 27 to be coated. The backplate 23 is disposed on a surface of the cavity 20 facing thereto, and has a gas guide hole 231 connected with the gas inlet 20a.

Figure 2:
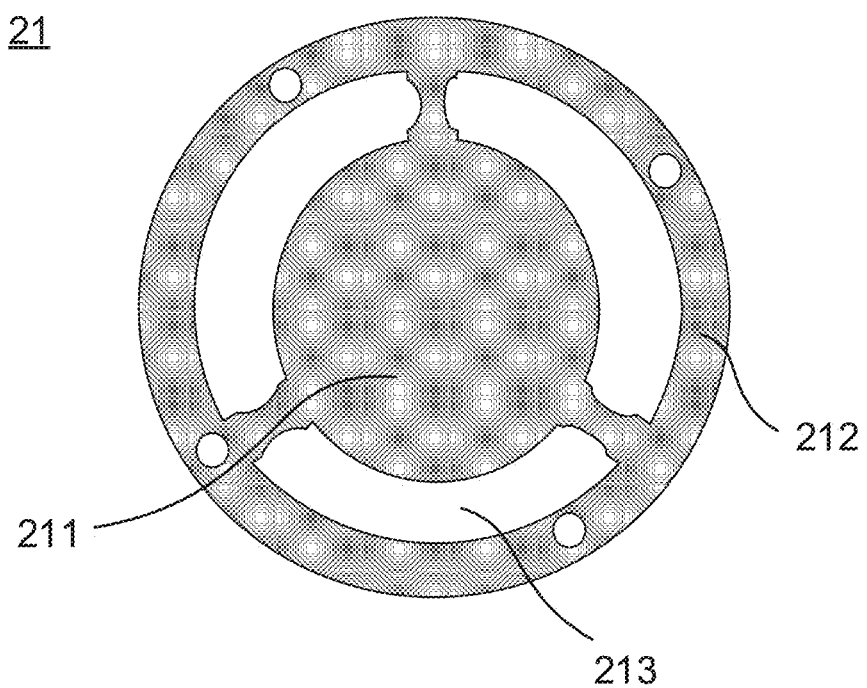
FIG. 2 is a schematic diagram illustrating a structure of a flow guide apparatus in FIG. 1.

As shown in FIGS. 1 and 2, the flow guide apparatus 21 includes a circular conical middle portion 211, an annular portion 212 connected with the middle portion 211, and a plurality of openings 213 are formed between the middle portion 211 and the annular portion 212. The flow guide apparatus 21 serves to guide gas that passes through the gas guide hole 231. The flow guide apparatus 21 is connected with the portion of the backplate 23 around the gas guide hole 231 through fasteners 25 such as screws.

Figure 3:
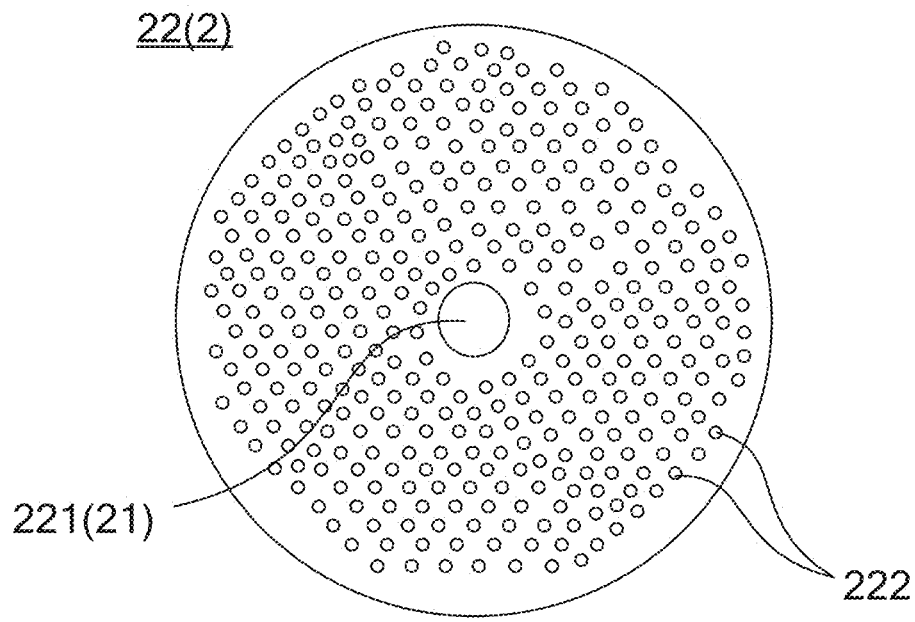
FIG. 3 is a schematic diagram illustrating a structure of a distributor.

As shown in FIGS. 1 and 3, the distributor 22 is provided with a plurality of uniformly distributed through holes 222, so that gas flow passing through the openings 213 of the flow guide apparatus 21 may be uniformly distributed. In this way, after the gas enters the cavity 20 through the gas inlet 20a in the cavity 20, the gas guide hole 231 in the backplate 23 guides the gas to the flow guide apparatus 21, and after being preliminarily guided and dispersed by the flow guide apparatus 21, the gas is uniformly dispersed by the distributor 22, and then is deposited on the substrate 27 carried by the carrier 26 through corresponding physical and/or chemical changes, so as to form a uniform film on the substrate 27. In order to facilitate connection between the distributor 22 and the flow guide apparatus 21, the distributor 22 is provided with a middle through hole 221, and a fastener 24 such as a screw passes through the middle through hole 221 to fix the distributor 22 to the middle portion 211 of the flow guide apparatus 21.

As shown in FIGS. 1 and 2, generally, a thickness T1 of the middle portion 211 of the flow guide apparatus 21 is approximately equal to a depth H1 of the gas guide hole 231 of the backplate 23, e.g., 25 mm, and a radius of a bottom face (i.e., a surface facing the distributor 22) of the middle portion 211 is approximately equal to two thirds of an inner diameter of the loop portion 212. A diameter of the bottom face of the middle portion 211 is approximately 87 mm, while an outer diameter of the fastener such as the screw connecting the middle portion 211 with the distributor 22 is only approximately 10 mm. This causes the diameter of the bottom face of the middle portion 211 to be much larger than the outer diameter of the used fastener such as the screw, thereby causing that the middle portion 211 has a large volume, and further causing a large weight of the flow guide apparatus 21.

In addition, since the middle portion 211 has a circular conical shape, a contact area between the gas flow and the middle portion 211 is large, so that acting force from the gas flow to which the flow guide apparatus 21 is subjected is large. Therefore, as time for which the vapor deposition device is used increases, the fasteners such as the screws connecting the flow guide apparatus 21 with the backplate 23 will vibrate due to gravity action of the flow guide apparatus 21 and the acting force of the gas flow to which the flow guide apparatus 21 is subjected, thereby causing that connection portions between the fasteners such as the screws and both the flow guide apparatus 21 and the backplate 23 are easily damaged due to friction, and affecting a quality of films formed due to that a large number of particulate foreign matters generated after the portions damaged due to the friction are eroded by the gas flow are deposited into the film layer along with the gas flow.

For example, a film to be formed is a certain film in an AMOLED panel. After particulate foreign matters are deposited into the film along with the gas flow, a circuit structure formed by films in the panel will be affected, such as causing a short circuit or an open circuit of the circuit structure, thereby causing an undesirable phenomenon of local bright or dark spots when the panel displays an image.

Figure 4:
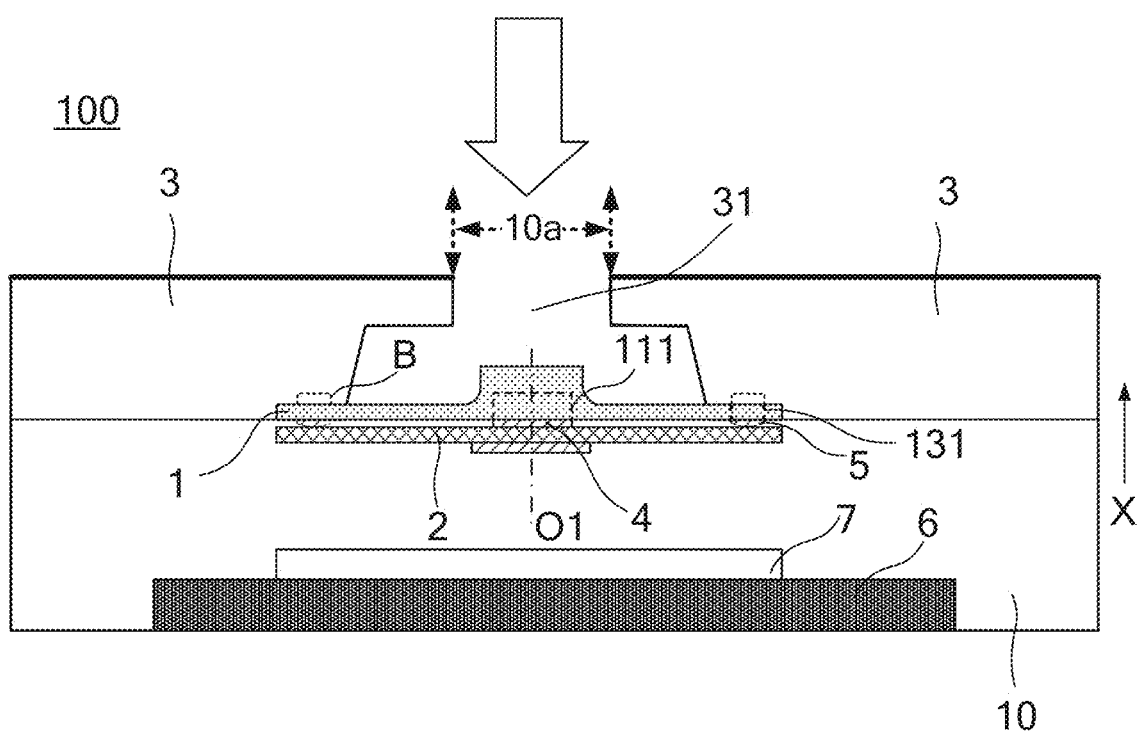
FIG. 4 is a schematic diagram illustrating a structure of a vapor deposition device; in accordance with some embodiments.

On this basis, some embodiments of the present disclosure provide a vapor deposition device 100. As shown in FIG. 4, the vapor deposition device 100 includes a cavity 10, and a flow guide apparatus 1, a distributor 2, a backplate 3 and a carrier 6 that are disposed in the cavity 10.

For example, the vapor deposition device 100 is a plasma enhanced chemical vapor deposition (PECVD) device. In this case, the above PECVD device may further include corresponding apparatus and/or structure capable of using a strong electric field or magnetic field to ionize molecules of the required gas source to generate plasma, which is not limited here.

As shown in FIG. 4, the cavity 10 is provided with a gas inlet 10a, which serves to introduce gas into the cavity 10, and a flow direction of the gas is shown by the downward arrow in FIG. 4. The backplate 3, the flow guide apparatus 1, the distributor 2 and the carrier 6 are disposed sequentially away from the gas inlet 10a. The carrier 6 is configured to carry a substrate 7 to be coated.

The backplate 3 is disposed on a surface of the cavity 10 facing thereto, and has a gas guide hole 31 connected with the gas inlet 10a. For example, in a first direction X pointing from the carrier 6 to the backplate 3, an orthogonal projection of the gas inlet 10a on a plane perpendicular to the first direction X is within an orthogonal projection of the gas guide hole 31 on the plane perpendicular to the first direction X.

In the embodiments of the present disclosure, the flow guide apparatus 1 and the distributor 2 are disposed opposite to each other in the first direction X, and they are detachably connected. In this way, the flow guide apparatus 1 and the distributor 2 are components separated from each other, which may be separately replaced, and are strong in maintainability and simple in manufacturing processes.

For example, as shown in FIG. 4, the vapor deposition device 100 further includes a first fastener 4. A surface of the flow guide apparatus 1 facing the distributor 2 is provided with a first blind hole 111 therein. As shown in FIG. 3, a center of the distributor 2 is provided with a fastening hole 21 therein, and the first fastener 4 is matched with the first blind hole 111 and the fastening hole 21 to connect the flow guide apparatus 1 with the distributor 2. In this way, reliability of the connection between the flow guide apparatus 1 and the distributor 2 is high, they are not easily separated, and an assembly process of them is simple and convenient.

In the embodiments of the present disclosure, in order to distinguish between different blind holes, the blind hole formed in the surface of the flow guide apparatus 1 facing the distributor 2 is referred to as the first blind hole 111, and blind holes formed in a surface of the backplate 3 facing the flow guide apparatus 1 are referred to as second blind holes B.

In the embodiment of the present disclosure, the flow guide apparatus 1 and the backplate 3 are detachably connected.

For example, as shown in FIG. 4, the vapor deposition device 100 further includes a plurality of second fasteners 5, The flow guide apparatus 1 is provided with a plurality of through holes 131 therein. The surface of the backplate 3 facing the flow guide apparatus 1 is provided with a plurality of second blind holes B therein, and the plurality of second blind holes B are located around the gas guide hole 31. The numbers of the second fasteners 5, the through holes 131 and the second blind holes B are equal, that is, each second fastener 5 is matched with a corresponding through hole 131 and a corresponding second blind hole B, so as to connect the flow guide apparatus 1 with a portion of the backplate 3 around the gas guide hole 31.

Figure 5:
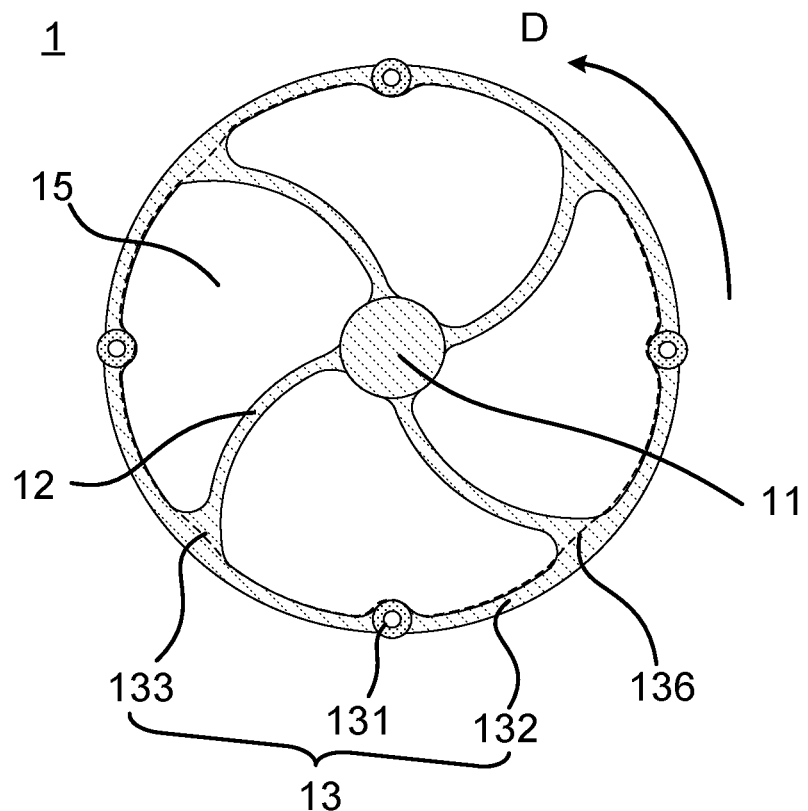
FIG. 5 is a schematic diagram illustrating a structure of another flow guide apparatus, in accordance with some embodiments.
Figure 6:
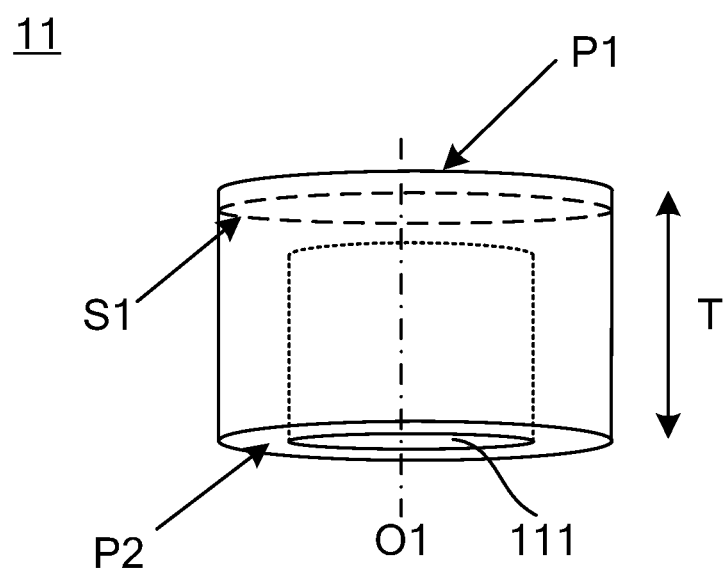
FIG. 6 is a schematic diagram illustrating a structure of a columnar flow guide portion, in accordance with some embodiments.

On the above basis, some embodiments of the present disclosure provide a flow guide apparatus 1, which is applied to the vapor deposition device 100 described in the above embodiments. As shown in FIGS. 4 to 6, the flow guide apparatus 1 includes a columnar flow guide portion 11, a plurality of connection portions 12 and a loop portion 13. The columnar flow guide portion 11 includes a first surface P1 and a second surface P2 that are perpendicular to a thickness direction T thereof, and the first blind hole 111 formed in the second surface P2. A center line O1 of the columnar flow guide portion 11 is parallel to the thickness direction T thereof. The plurality of connection portions 12 are at least connected with an edge of the second surface P2 of the columnar flow guide portion 11. The loop portion 13 is connected with the plurality of connection portions 12, and is farther away from the columnar flow guide portion 11 than the plurality of connection portions 12. The plurality of connection portions 12 are arranged at intervals between the columnar flow guide portion 11 and the loop portion 13, so that there is an opening 15 through which gas flow passes between any two adjacent connection portions 12.

In the embodiments of the present disclosure, the center line O1 of the columnar flow guide portion 11 is a virtual line segment, which is a hypothetical connection line between a center point of the first surface P1 and a center point of the second surface P2, and indicates that the columnar flow guide portion 11 is centrosymmetric with respect to the line segment. That is, the columnar flow guide portion 11 is upright.

In some examples, the first surface P1 and the second surface P2 have the same shape and the same area. For example, the first surface P1 and the second surface P2 both have a circular shape and have the same area.

Of course, the first surface P1 and the second surface P2 may also have different shapes and/or different areas. For example, the first surface P1 has a circular shape, and the second surface P2 has a rounded polygonal shape. The embodiments of the present disclosure do not limit the shapes and areas of the first surface P1 and the second surface P2 of the columnar flow guide portion 11, as long as it is ensured that the first surface P1 and the second surface P2 are parallel and perpendicular to the thickness direction T of the columnar flow guide portion 11, and the center line O1 of the columnar flow guide portion 11 is parallel to the thickness direction T thereof.

Moreover, the embodiments of the present disclosure do not limit the thickness of the columnar flow guide portion 11, as long as the thickness of the columnar flow guide portion 11 may satisfy that the first blind hole 111 for connecting the distributor 2 is formed in the second surface P2, For example, the thickness of the columnar flow guide portion 11 may be 10 mm.

Through the flow guide apparatus 1 in the embodiments of the present disclosure, on a premise of ensuring that the columnar flow guide portion 11 is connected with the distributor 2 through the first fastener 4, compared with that the middle portion 211 of the vapor deposition device 200 has a circular conical shape, a contact area between the gas flow and the columnar flow guide portion 11 may be reduced. In this way, impact force of the gas flow on the columnar flow guide portion 11 may be reduced, and acting force to which the second fasteners 5 are subjected under action of gravity of the columnar flow guide portion 11 and the gas flow may be reduced, thereby making friction force between the second fasteners 5 and both the backplate 3 and the flow guide apparatus 1 small, and preventing foreign matters such as particles from being generated in the cavity due to friction to avoid adverse effects of the foreign matters on a film layer. In addition, the number of times of maintaining the device caused by abnormalities may be reduced, a production capacity may be effectively improved, and manufacturing costs may be reduced.

In some embodiments, a cross section of the columnar flow guide portion 11 parallel to the first surface P1 has a shape of an approximate circle, so as to further reduce the impact force from the gas flow to which the columnar flow guide portion 11 is subjected.

For example, as shown in FIG. 6, a cross section S1 of the columnar flow guide portion 11 parallel to the first surface P1 has a circular shape, in this case, the columnar flow guide portion 11 is a circular cylinder.

For another example, a cross section of the columnar flow guide portion 11 parallel to the first surface P1 has an elliptical shape, in this case, the columnar flow guide portion 11 is an elliptic cylinder.

Of course, a cross section of the columnar flow guide portion 11 parallel to the first surface P1 may also have other shapes. For example, it has a pentagonal shape, that is, the columnar flow guide portion 11 is a pentagonal prism. For another example, it has a hexagonal shape, that is, the columnar flow guide portion 11 is a hexagonal prism.

In the embodiments of the present disclosure, shapes of a plurality of cross sections of the columnar flow guide portion 11 parallel to the first surface P1 may be exactly the same, or may not be exactly the same. Here, "being exactly the same" means that any cross section of the columnar flow guide portion 11 parallel to the first surface P1 has the same shape. For example, in the above embodiments, any cross section of the columnar flow guide portion 11 parallel to the first surface P1 has a circular shape. "Being not exactly the same" means that the shapes of the plurality of cross sections of the columnar flow guide portion 11 parallel to the first surface P1 are partially the same or partially different. For example, partial cross sections of the columnar flow guide portion 11 parallel to the first surface P1 have a circular shape, and partial cross sections thereof have a polygonal shape, that is, the columnar flow guide portion 11 is of an irregularly structure. The embodiments of the present disclosure do not limit a shape of the columnar flow guide portion 11, as long as the columnar flow guide portion 11 has the first surface P1 and the second surface P2 that are perpendicular to the thickness direction T thereof, and the center line O1 of the columnar flow guide portion 11 is parallel to the thickness direction T thereof.

In some embodiments, all of the cross sections of the columnar flow guide portion 11 parallel to the first surface P1 have exactly the same shape and exactly the same area. That is, the columnar flow guide portion 11 is an upright column.

For example, all of the cross sections of the columnar flow guide portion 11 parallel to the first surface P1 have a circular shape and exactly the same area, That is, the columnar flow guide portion 11 is a circular cylinder.

For another example, all of the cross sections of the columnar flow guide portion 11 parallel to the first surface P1 have a polygonal shape and exactly the same area. That is, the columnar flow guide portion 11 is a prism.

In this way, on a premise of ensuring that the columnar flow guide portion 11 is tightly connected with the distributor 2 through the first fastener 4, a volume of the columnar flow guide portion 11 may be reduced to a great extent to reduce an overall weight of the flow guide apparatus 1, so that influence of the gravity action of the columnar flow guide portion 11 on the friction force between the second fasteners 5 and both the backplate 3 and the flow guide apparatus 1 may be reduced. Moreover, the columnar flow guide portion 11 is in a shape of an upright column, so that the openings 15 between the columnar flow guide portion 11 and the loop portion 13 have a large area, gas intake is smooth, and an amount of the gas flow is large. And compared with a circular cone, a contact area between the upright column and the gas flow is smaller, so that the acting force of the gas flow to which the flow guide apparatus 1 is subjected is reduced, thereby reducing the friction force between the second fasteners 5 and both the backplate 3 and the flow guide apparatus 1, reducing the number of the particulate foreign matters between the second fasteners 5 and both the backplate 3 and the flow guide apparatus 1, and reducing a defect rate of the product. In addition, the columnar flow guide portion 11 is regular in structure, which is convenient for manufacturing, and is high in overall structural strength, difficult to damage and high in reliability.

Figure 7A:
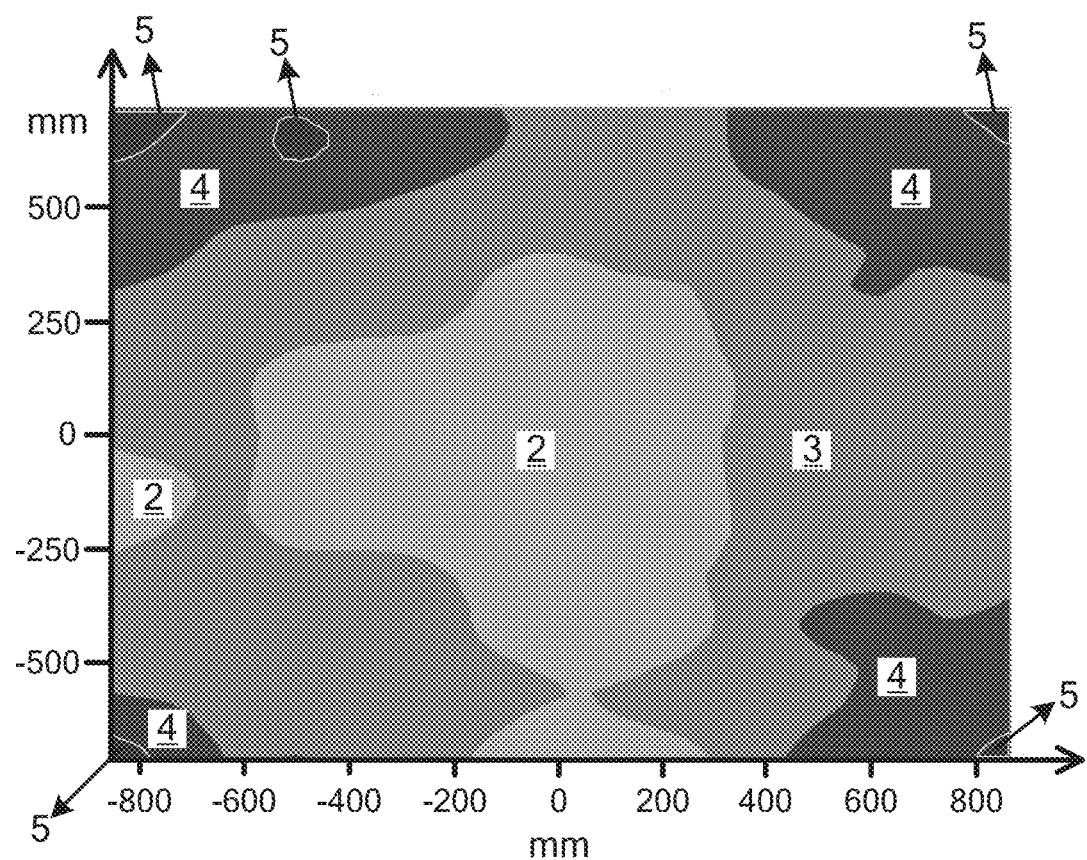
FIG. 7A is a contour map of a thickness of a silicon oxide ($SiO_x$) film formed by using the vapor deposition device shown in FIG. 1.
Figure 7B:
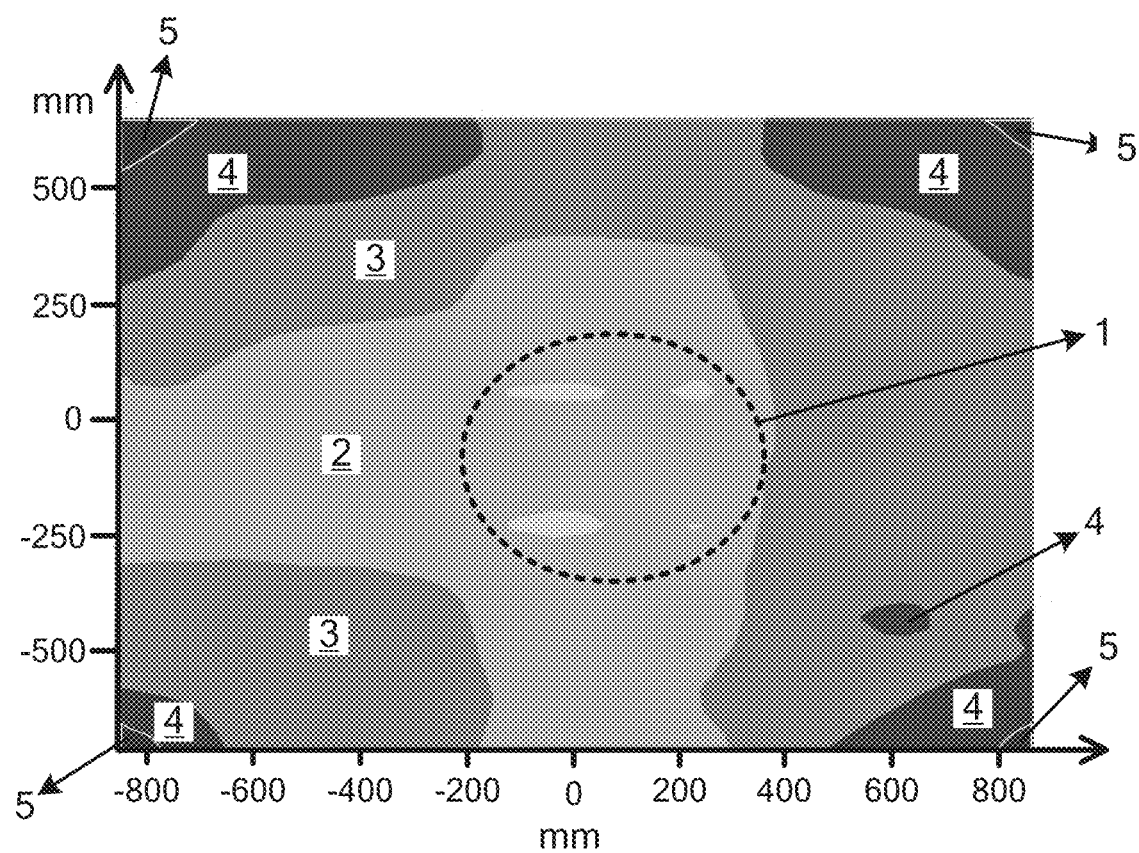
FIG. 7B is a contour map of a thickness of a silicon oxide ($SiO_x$) film formed by using the vapor deposition device shown in FIG. 4.

FIG. 7A is a contour map of a thickness of a silicon oxide ($SiO_x$) film formed in the vapor deposition device 200 shown in FIG. 1 by means of PECVD, and FIG. 7B is a contour map of a thickness of a $SiO_x$ film formed in the vapor deposition device 100 shown in FIG. 4 by means of PECVD. In FIGS. 7A and 7B, the number 1 represents a region where the thickness of the film is less than 5800 angstroms (Å), the number 2 represents a region where the thickness of the film is in a range of 5800 Å to 5920 Å, inclusive, the number 3 represents a region where the thickness of the film layer is in a range of 5920 Å to 6040 Å, inclusive, the number 4 represents a region where the thickness of the film layer is in a range of 6040 Å to 6160 Å, inclusive, and the number 5 represents a region where the thickness of the film layer is greater than 6280 Å. It can be seen from FIGS. 7A and 7B that, uniformities of the thicknesses of the $SiO_x$ films formed by using the vapor deposition device 200 shown in FIG. 1 and the vapor deposition device 100 shown in FIG. 4 are both greater than 7%. That is to say, the thicknesses of the films formed by using the two vapor deposition devices are both uniform, which indicates that a film with good thickness uniformity may still be obtained by using the flow guide apparatus 1 provided by the embodiments of the present disclosure.

In some examples, as shown in FIG. 6, the columnar flow guide portion 11 is a circular cylinder, and the first blind hole 111 formed in the second surface P2 of the columnar flow guide portion 11 is a circular hole. Thus, when a size of the columnar flow guide portion 11 is designed, as long as an outer diameter of the columnar flow guide portion 11 is slightly larger than an inner diameter of the first blind hole 111, which is determined according to an outer diameter of the first fastener 4. That is, the outer diameter of the columnar flow guide portion 11 should be slightly larger than the outer diameter of the first fastener 4. Of course, a person skilled in the art will know that, when the size of the columnar flow guide portion 11 is designed, influence of the size of each portion in the columnar flow guide portion 11 on flow guide effect should also be considered to improve the flow guide effect as much as possible.

For example, the outer diameter of the first fastener 4 is 10 mm, and then the outer diameter of the columnar flow guide portion 11 may be designed to be in a range of 23 mm to 27 mm, inclusive. For example, the outer diameter of the columnar flow guide portion 11 is 23 mm, 24 mm, 25 mm, 26 mm, or 27 mm. In this way, the volume of the columnar flow guide portion 11 may be reduced to a great degree while ensuring that the columnar flow guide portion 11 is tightly connected with the distributor 2, and the columnar flow guide portion 11 preliminarily guides the gas flow from the gas guide hole 31 of the backplate 3. The embodiments of the present disclosure do not limit this, as long as it is ensured that the first blind hole 111 is formed in the second surface P2 of the columnar flow guide portion 11, and the columnar flow guide portion 11 is tightly connected with the distributor 2 by matching the first fastener 4 with the first blind hole 111.

For example, as shown in FIGS. 4 and 6, a center line of the first blind hole 111 coincides with the center line O1 of the columnar flow guide portion 11. In this way, the first blind hole 111 is located at a center of the second surface P2 of the columnar flow guide portion 11, and a distance between an inner wall of the first blind hole 111 and a circumferential outer wall of the columnar flow guide portion 11 is uniform, and when the first blind hole 111 is formed in the columnar flow guide portion 11, the columnar flow guide portion 11 is not easy to crack, thereby reducing a risk of cracking of the columnar flow guide portion 11 in the process of forming the first blind hole 111.

Figure 8A:
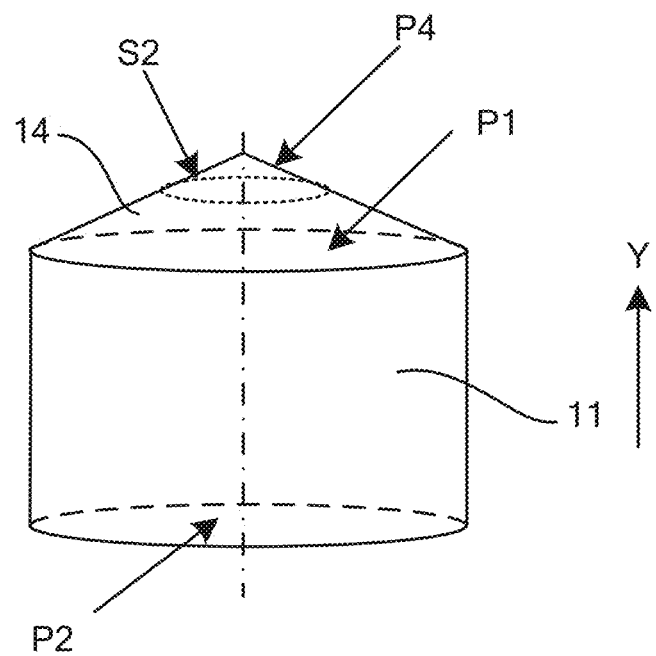
FIG. 8A is a schematic diagram illustrating a structure in which a columnar flow guide portion is combined with an auxiliary flow guide portion, in accordance with some embodiments.
Figure 8B:
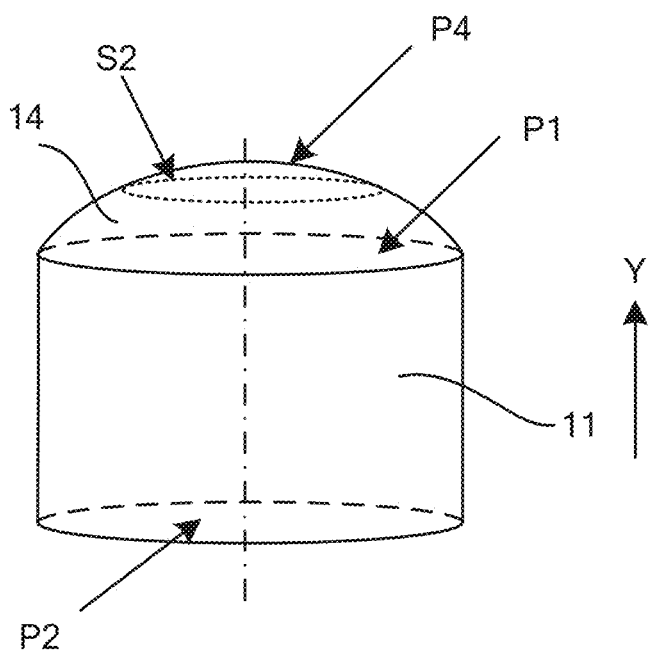
FIG. 8B is a schematic diagram illustrating a structure in which columnar flow guide portion is combined with another auxiliary flow guide portion, in accordance with some embodiments.
Figure 8C:
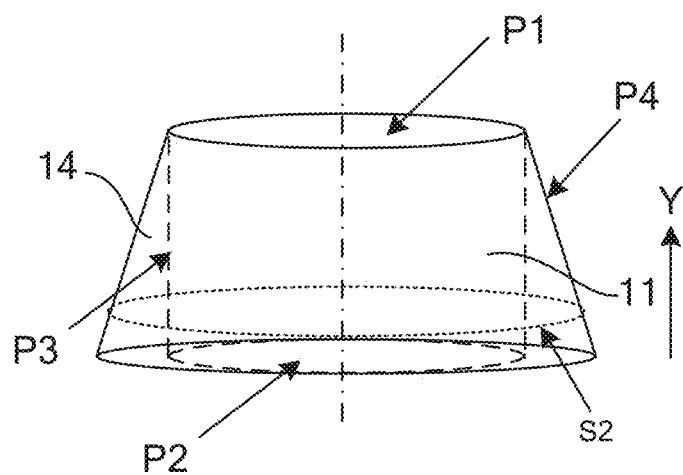
FIG. 8C is a schematic diagram illustrating a structure in which columnar flow guide portion is combined with yet another auxiliary flow guide portion, in accordance with some embodiments.

In some embodiments, as shown in FIGS. 8A to 8C, the flow guide apparatus 1 further includes an auxiliary flow guide portion 14 disposed on a surface of the columnar flow guide portion 11, and in a second direction Y pointing from the second surface P2 to the first surface P1, an area of a cross section S2 of the auxiliary flow guide portion 14 parallel to the first surface P1 progressively decreases.

In this way, a flow guide surface P4 of the auxiliary flow guide portion 14 is at a certain angle with a flow direction of the gas flow passing through the gas guide hole 31 of the backplate 3. As a result, the gas flow is gradually dispersed to a periphery under guidance of the flow guide surface 141, and the auxiliary flow guide portion 14 has a further guide effect on the dispersion of the gas flow, so that the impact force of the gas flow on the flow guide apparatus 1 may be reduced, vibration generated between the second fasteners 5 and both the backplate 3 and the flow guide apparatus 1 due to the impact force of the gas flow may be weakened, and the number of the particulate foreign matters between the second fasteners 5 and both the backplate 3 and the flow guide apparatus 1 may be further reduced.

In some examples, as shown in FIGS. 8A and 8B, the auxiliary flow guide portion 14 is disposed on the first surface P1 of the columnar flow guide portion 11.

For example, the flow guide surface P4 of the auxiliary flow guide portion 14 has a shape of an approximate circular conical surface or at least a part of a spherical surface, such as a hemispherical surface.

In some other examples, as shown in FIG. 8C, the columnar flow guide portion 11 further includes a side face P3 connected with the first surface P1 and the second surface P2, and the auxiliary flow guide portion 14 is disposed on the side face P3 of the columnar flow guide portion 11, and a shape formed by the auxiliary flow guide portion 14 and the columnar flow guide portion 11 is a truncated circular cone. In this way, the flow guide surface P4 of the auxiliary flow guide portion 14 is a side face of the truncated circular cone, which may effectively guide the flow direction of the gas flow.

On this basis, the connection portions 12 are further directly connected with the auxiliary flow guide portion 14. For example, the connection portions 12 are further directly connected with the flow guide surface P4 of the auxiliary flow guide portion 14, which strengthens structural stability of the flow guide apparatus 1.

In some embodiments, the auxiliary flow guide portion 14 and the columnar flow guide portion 11 are of an integral structure, so that the overall structural strength of the flow guide apparatus 1 is high, and a manufacturing process is simple. Of course, the flow guide surface P4 of the auxiliary flow guide portion 14 may also have other shapes, which are not limited here.

Figure 9:
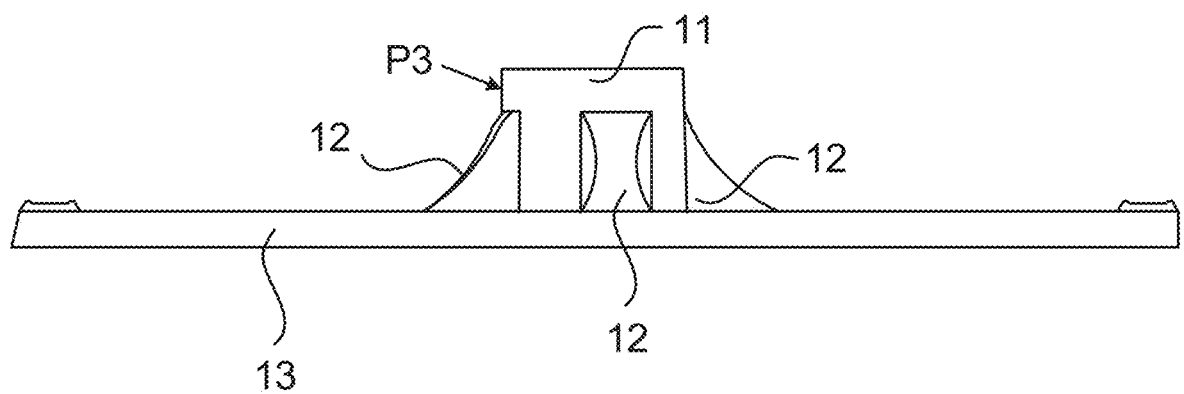
FIG. 9 is a schematic diagram illustrating a structure in which a columnar flow guide portion is connected with a plurality of connection portions, in accordance with some embodiments.

In some embodiments, as shown in FIG. 9, each connection portion 12 is further connected with the side face P3 of the columnar flow guide portion 11. That is to say, the connection portion 12 is connected with the edge of the second surface P2 and the side face P3 of the columnar flow guide portion 11, thereby ensuring firmness of the connection between the connection portion 12 and the columnar flow guide portion 11, and strengthening the structural stability of the flow guide apparatus 1.

In some examples, as shown in FIG. 9, in a direction from the columnar flow guide portion 11 to the loop portion 13, a thickness of a portion of the connection portion 12 connected with the side face P3 progressively decreases. In this way, the portion of the connection portion 12 connected with the side face P3 of the columnar flow guide portion 11 may further have a certain guide effect on the flow direction of the gas flow from the gas guide hole 31 of the backplate 3, so that the gas flow may be fully dispersed to a periphery of the columnar flow guide portion 11, and the preliminary flow guide effect of the flow guide apparatus 1 on the gas flow is enhanced.

In some embodiments, as shown in FIG. 5, the plurality of connection portions 12 are uniformly distributed in a circumferential direction of the columnar flow guide portion 11, and are bent toward a counterclockwise direction D. In this way, the bending directions of the plurality of connection portions 12 are the same, which may strengthen the guide effect on the gas flow. In addition, the bending directions of the plurality of connection portions 12 are the same, which may also make force of bearing the loop portion 13 equally distributed to the plurality of connection portions 12, thereby avoiding concentration of stress and making the structural stability of the flow guide apparatus 1 high. Of course, the plurality of connection portions 12 may also be bent toward a clockwise direction, that is, the bending direction of each connection portion 12 is opposite to that in FIG. 5.

The embodiments of the present disclosure do not limit the number of the plurality of connection portions, as long as the plurality of connection portions can connect the loop portion 13 with the columnar flow guide portion 11. For example, there may be three, four or five connection portions 12, which may reduce the weight of the flow guide apparatus 1 itself while ensuring the flow guide effect thereof.

In some embodiments, as shown in FIG. 5, an inner ring 136 of the loop portion 13 has a circular shape. In this way, the opening between the loop portion 13 and the columnar flow guide portion 11 may be uniformly divided into a plurality of regions by the plurality of connection portions 12, so that the gas flow is uniformly dispersed into the distributor 2, and uniformity of the dispersion of the gas flow is improved.

The embodiments of the present disclosure do not limit a shape of an outer ring of the loop portion 13. The outer ring of the loop portion 13 may have a circular shape shown in FIG. 5, or other shapes such as a square shape or a polygonal shape, as long as it is ensured that the flow guide apparatus 1 is connected with the backplate 3 through the loop portion 13.

In some embodiments, as shown in FIG. 5, the loop portion 13 includes a plurality of through holes 131, and the plurality of through holes 131 serve to make the second fasteners 5 passthrough to connect with the backplate 3.

In some examples, the loop portion 13 further includes a plurality of loop sub-portions 132 and a plurality of intermediate sub-portions 133. Each intermediate sub-portion 133 is located between two adjacent loop sub-portions 132, and is connected with a respective one of the plurality of connection portions 12.

For example, as shown in FIG. 5, each through hole 131 is formed in one loop sub-portion 132. For another example, each through hole 131 is formed in one intermediate sub-portion 133. Of course, some of the plurality of through holes 131 may also be formed in the loop sub-portions 132, and the remaining through holes 131 are formed in the intermediate sub-portions 133. The embodiments of the present disclosure do not limit this, as long as the plurality of connection portions 12 may be uniformly distributed.

The embodiments of the present disclosure do not limit a size of the through holes 131 and a size of the loop portion 13, as long as it is ensured that the size of the through holes 131 is matched with a size of the second fasteners 5, that is, the size of the through holes 131 may be designed according to the size of the second fasteners 5 (e.g., an outer diameter of screws). The loop portion 13 only needs to have a size capable of making the through holes 131 be formed thereon. For example, the outer ring of the loop portion 13 has a circular shape, a diameter of the outer ring is 150 mm, a thickness of the loop portion 13 is 5 mm, and a diameter of the through holes 131 is 2.5 mm.

The flow guide apparatus 1 in the embodiments of the present disclosure may be formed by connecting the columnar flow guide portion 11, the plurality of connection portions 12 and the loop portion 13 that are separate. Or, the columnar flow guide portion 11, the plurality of connection portions 12 and the loop portion 13 may also be connected to form an integral structure.

In some embodiments, as shown in FIG. 4, regardless of whether the flow guide apparatus 1 is formed by connecting the columnar flow guide portion 11, the plurality of connection portions 12 and the loop portion 13 that are separate, or is of an integral structure, the surface of the flow guide apparatus 1 facing the distributor 2 is a flat surface.

As shown in FIG. 4, since the distributor 2 has a disc-shaped structure with a uniform thickness, the surface of the flow guide apparatus 1 facing the distributor 2 is a flat surface, so that a gap between the flow guide apparatus 1 and the distributor 2 may be made small, that is, a part of the gas passing through the flow guide apparatus 1 is prevented from passing through the gap between the flow guide apparatus 1 and the distributor 2, so as to improve the flow guide effect on the gas flow and make the gas uniformly distributed in the cavity, thereby facilitating to obtain a film layer with a uniform deposition thickness.

In some embodiments, the flow guide apparatus 1 is made of light metal. For example, the columnar flow guide portion 11, the connection portions 12 and the loop portion 13 of the flow guide apparatus 1 are all made of light metal. Here, the light metal refers to a metal with a density of less than 5 g/cm$^3$, such as beryllium (Be), aluminum (Al), magnesium (Mg), strontium (Sr) or the like. The flow guide apparatus 1 made of the light metal has high strength and light weight, so that the vibration between the second fasteners 5 and both the backplate 3 and the flow guide apparatus 1 may be made weak, and the friction force may be made small, thereby reducing the number of the particulate foreign matters between the second fasteners 5 and both the backplate 3 and the flow guide apparatus 1.

In some other examples, the flow guide apparatus 1 may be made of an ultra-strong lightweight structural metal with a very high specific strength, specific modulus or hardness ratio, such as low-cost titanium alloy and aluminum alloy.

Figure 10:
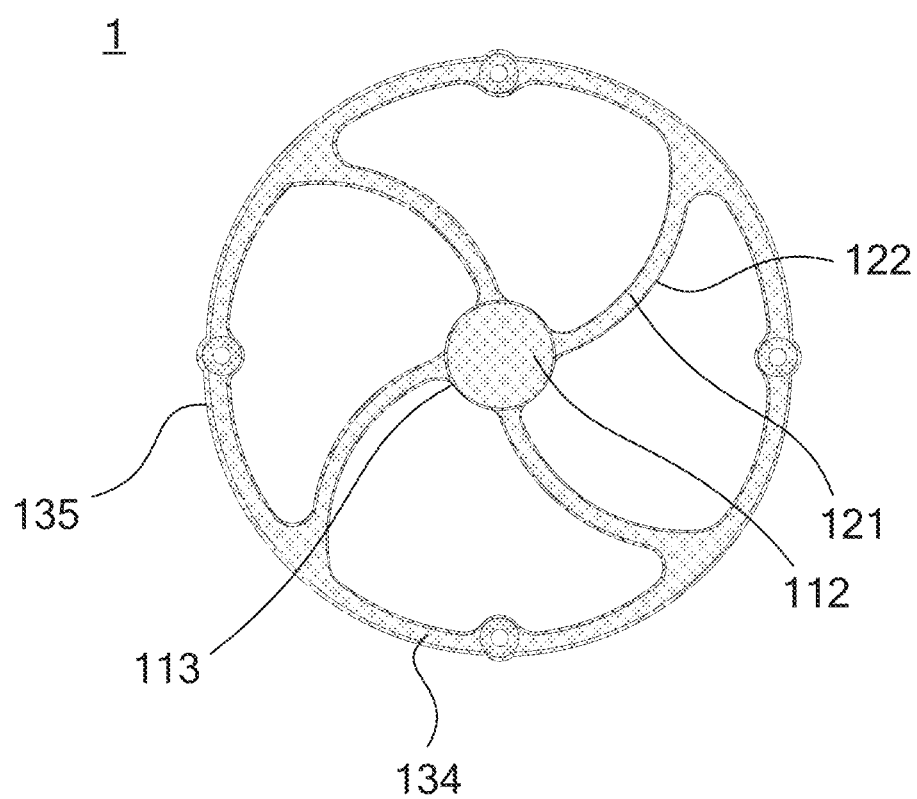
FIG. 10 is a schematic diagram illustrating a structure of yet another flow guide apparatus; in accordance with some embodiments.

In some examples, as shown in FIG. 10, the columnar flow guide portion 11 further includes a first main body portion 112 and a first corrosion prevention layer 113 disposed on a surface of the first main body portion 112. The connection portion 12 further includes a second main body portion 121 and a second corrosion prevention layer 122 disposed on a surface of the second main body portion 121. The loop portion 13 further includes a third main body portion 134 and a third corrosion prevention layer 135 disposed on a surface of the third main body portion 134. Any main body portion may be made of the above light metal.

It will be noted that since FIG. 10 shows a top view structure of the flow guide apparatus 1, in order to clearly illustrate the first main body portion 112, the second main body portion 121 and the third main body portion 134, a portion of the first corrosion prevention layer 113 covers an upper surface of first main body portion 112, a portion of the second corrosion prevention layer 122 covers an upper surface of second main body portion 121, and a portion of the third corrosion prevention layer 135 covers an upper surface of the third main body are all not shown in FIG. 10.

In a case where the flow guide apparatus 1 is of an integral structure, the first main body portion 112 in the columnar flow guide portion 11, the second main body portion 121 in the connection portion 12, and the third main body portion 134 in the loop portion 13 may also form an integral structure, and the first corrosion prevention layer 113 in the columnar flow guide portion 11, the second corrosion prevention layer 122 in the connection portion 12, and the third corrosion prevention layer 135 in the loop portion 13 may also form an integral structure (i.e., a whole corrosion prevention layer), so as to prevent the gas flow from corroding the flow guide apparatus 1.

In a case where the flow guide apparatus 1 is formed by connecting the columnar flow guide portion 11, the plurality of connection portions and the loop portion that are separate, the first main body portion 112, the second main body portion 121 and the third main body portion 134 may be connected with each other, and the first corrosion prevention layer 113, the second corrosion prevention layer 122 and the third corrosion prevention layer 135 may be also connected with each other, so as to form a corrosion prevention layer on an outermost side of the flow guide apparatus 1 to prevent the gas flow from corroding the flow guide apparatus 1.

The corrosion prevention layers in the embodiments of the present disclosure may be metal protective layers or non-metal protective layers.

In some examples, the corrosion prevention layers are non-metal protective layers, which may be formed on outer surfaces of the main body portions of the flow guide apparatus 1 by means of coating. For example, a material of the non-metal protective layers is any one of paint, plastic, rubber, and anti-rust oil.

In some other examples, the corrosion prevention layers are metal protective layers, and a material of the metal protective layers may be aluminum oxide, which has stable chemical properties, high strength and low cost. For example, the aluminum oxide may be deposited on the outer surfaces of the main body portions of the flow guide apparatus 1 by means of CVD. Of course, the metal protective layers may also be formed by using other methods, which are not limited in the embodiments of the present disclosure.

In some other embodiments, the flow guide apparatus 1 may be made of alumina or ceramic. For example, the columnar flow guide portion 11, the connection portions 12 and the loop portion 13 of the flow guide apparatus 1 are all made of alumina or ceramic. Solid alumina has good insulativity, high safety and stable chemical properties, will not react with the gas, and may effectively prevent the flow guide apparatus 1 from being corroded by the gas.

In the vapor deposition device 100 provided by the above embodiments, as shown in FIGS. 4 and 6, the first fastener 4 is matched with the first blind hole 111 formed in the second surface P2 of the columnar flow guide portion 11 and the fastening hole 21 formed in the distributor 2, so as to achieve the detachable connection between the flow guide apparatus 1 and the distributor 2.

For example, the first fastener 4 is a screw, and the fastening hole 21 and the first blind hole 111 are both threaded holes matched with the screw. For another example, the first fastener 4 is a bolt, and the fastening hole 21 and the first blind hole 111 are both threaded holes matched with the bolt.

In some examples, as shown in FIG. 5, each second fastener 5 is matched with a respective one of the plurality of through holes 131 formed in the loop portion 13 of the flow guide apparatus 1, and a respective one of the plurality of second blind holes B formed in the surface of the backplate 3 facing the flow guide apparatus 1, so as to achieve the detachable connection between the flow guide apparatus 1 and the backplate 3.

For example, the second fastener 5 is a screw, and the through hole and the second blind hole are both threaded holes matched with the screw. For another example, the second fastener 5 is a bolt, and the through hole and the second blind hole are both threaded holes matched with the screw. In this way, stability of the connection between the flow guide apparatus 1 and the backplate 3 is strong, and an assembly process of them is simple and convenient.

In the vapor deposition device 100 provided by some embodiments, the center line of the gas guide hole 31 of the backplate 3 is collinear with the center line O1 of the columnar flow guide portion 11. In this way, the columnar flow guide portion 11 may make the gas flow from the gas guide hole 31 uniformly dispersed to the periphery.

Beneficial effects of the vapor deposition device provided by the embodiments of the present disclosure are the same as those of the flow guide apparatus provided by the above embodiments, and details will not be repeated herein.

The foregoing descriptions are merely specific implementations of the present disclosure, but the protection scope of the present disclosure is not limited thereto, and any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A flow guide apparatus, comprising:
    a columnar flow guide portion, the columnar flow guide portion including a first surface and a second surface that are perpendicular to a thickness direction thereof, and a blind hole formed in the second surface, and a center line of the columnar flow guide portion being parallel to the thickness direction thereof;
a plurality of connection portions arranged at intervals, the plurality of connection portions being at least connected with an edge of the second surface of the columnar flow guide portion;
a loop portion, the loop portion being connected with the plurality of connection portions, and being farther away from the columnar flow guide portion than the plurality of connection portions; and
an auxiliary flow guide portion disposed on a surface of the columnar flow guide portion, wherein
in a direction pointing from the second surface to the first surface, an area of a cross section of the auxiliary flow guide portion parallel to the first surface decreases.

2. The flow guide apparatus according to claim 1, wherein a cross section of the columnar flow guide portion parallel to the first surface has a shape of an approximate circle.

3. The flow guide apparatus according to claim 2, wherein an inner ring of the loop portion has a circular shape.

4. The flow guide apparatus according to claim 2, wherein a diameter of the circle is in a range of 23 mm to 27 mm, inclusive.

5. The flow guide apparatus according to claim 1, wherein the surface where the auxiliary flow guide portion is located is the first surface.

6. The flow guide apparatus according to claim 5, wherein a flow guide surface of the auxiliary flow guide portion has a shape of at least a part of a spherical surface.

7. The flow guide apparatus according to claim 1, wherein the columnar flow guide portion further includes a side face connected with the first surface and the second surface, and the surface where the auxiliary flow guide portion is located is the side face; and
the auxiliary flow guide portion and the columnar flow guide portion are of an integral structure in a shape of a truncated circular cone.

8. The flow guide apparatus according to claim 7, wherein each connection portion is further directly connected with the auxiliary flow guide portion.

9. The flow guide apparatus according to claim 1, wherein the columnar flow guide portion further includes a side face connected with the first surface and the second surface, and each connection portion is further connected with the side face.

10. The flow guide apparatus according to claim 9, wherein in a direction from the columnar flow guide portion to the loop portion, a thickness of a portion of the each connection portion connected with the side face decreases.

11. The flow guide apparatus according to claim 1, wherein the plurality of connection portions are bent toward a clockwise direction or a counterclockwise direction.

12. The flow guide apparatus according to claim 1, wherein a number of the plurality of connection portions is three, four or five.

13. The flow guide apparatus according to claim 1, wherein the loop portion comprises:
a plurality of through holes;
a plurality of loop sub-portions; and
a plurality of intermediate sub-portions, each intermediate sub-portion being located between two adjacent loop sub-portions, and being connected with a respective one of the plurality of connection portions;
wherein each through hole is formed in a respective one of the plurality of loop sub-portions or the plurality of intermediate sub-portions.

14. The flow guide apparatus according to claim 1, wherein a material of the columnar flow guide portion includes light metal.

15. The flow guide apparatus according to claim 14, wherein the columnar flow guide portion further includes a main body portion and a corrosion prevention layer disposed on a surface of the main body portion;
wherein a material of the main body portion is the light metal.

16. The flow guide apparatus according to claim 1, wherein a material of the columnar flow guide portion includes alumina or ceramic.

17. A vapor deposition device, comprising:
the flow guide apparatus according to claim 1;
a distributor disposed opposite to the flow guide apparatus; and
a first fastener, the first fastener being matched with the blind hole and being connected with the distributor;
wherein the distributor is fixed to the columnar flow guide portion through the first fastener.

18. The vapor deposition device according to claim 17, wherein the loop portion includes a plurality of through holes; and
the vapor deposition device further comprises:
a backplate, the backplate being disposed on a side of the flow guide apparatus facing away from the distributor; and
a plurality of second fasteners, each second fastener being matched with a respective one of the plurality of through holes;
wherein the backplate is fixed to the loop portion through the plurality of second fasteners.

19. The flow guide apparatus according to claim 5, wherein a flow guide surface of the auxiliary flow guide portion has a shape of an approximate circular conical surface.

* * * * *